US006795961B2

(12) United States Patent
Liebmann et al.

(10) Patent No.: US 6,795,961 B2
(45) Date of Patent: Sep. 21, 2004

(54) PRIORITY COLORING FOR VLSI DESIGNS

(75) Inventors: Lars W. Liebmann, Poughquag, NY (US); Carlos A. Fonseca, Staten Island, NY (US); Ioana Graur, Poughkeepsie, NY (US); Young O. Kim, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/430,148

(22) Filed: May 6, 2003

(65) Prior Publication Data

US 2003/0200524 A1 Oct. 23, 2003

Related U.S. Application Data

(62) Division of application No. 09/997,657, filed on Nov. 29, 2001, now Pat. No. 6,609,245.

(51) Int. Cl.[7] .............................................. G06F 17/50
(52) U.S. Cl. ......................................... 716/19; 719/21
(58) Field of Search ............................... 716/19, 21, 11, 716/4, 10, 7, 5; 430/5, 30

(56) References Cited

U.S. PATENT DOCUMENTS

| 5,883,813 | A | * | 3/1999 | Kim et al. ..................... 716/19 |
| 6,066,180 | A | * | 5/2000 | Kim et al. ..................... 716/19 |
| 6,524,752 | B1 | * | 2/2003 | Pierrat ............................ 430/5 |
| 6,664,009 | B2 | * | 12/2003 | Liu .................................. 430/5 |
| 2003/0093766 | A1 | * | 5/2003 | Liebmann et al. ............ 716/19 |

* cited by examiner

Primary Examiner—Vuthe Siek
Assistant Examiner—Binh Tat
(74) Attorney, Agent, or Firm—Todd M. C. Li

(57) ABSTRACT

A method and computer program product is described for optimizing the design of a circuit layout that assigns binary properties to the design elements according to a hierarchy of rules. For example, the design of an alternating phase shifted mask (altPSM) is optimized first according to rules that assign phase shapes that maximize image quality for critical circuit elements, and then further optimized to minimize mask manufacturability problems without significantly increasing the complexity of the design process flow. Further optimization of the design according to additional rules can be performed in a sequentially decreasing priority order. As the priority of rules decrease, some violation of lower priority rules may be acceptable, as long as higher priority rules are not violated.

2 Claims, 16 Drawing Sheets

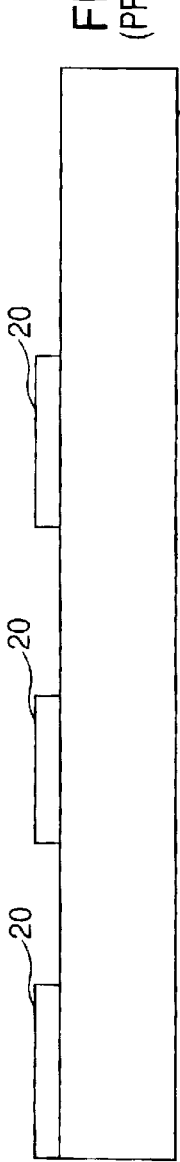
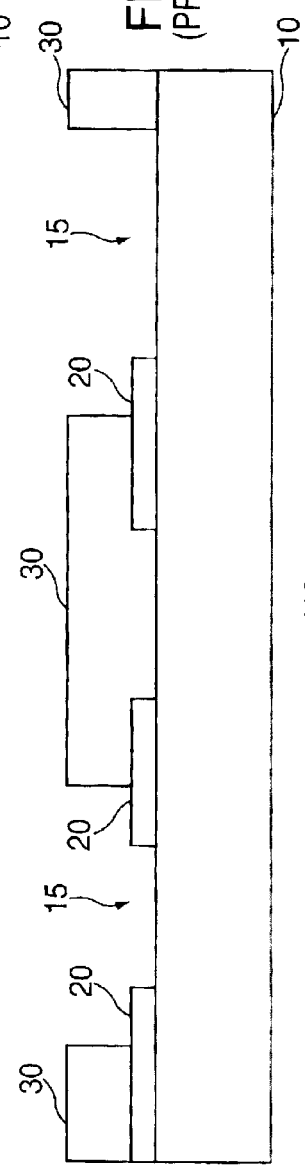
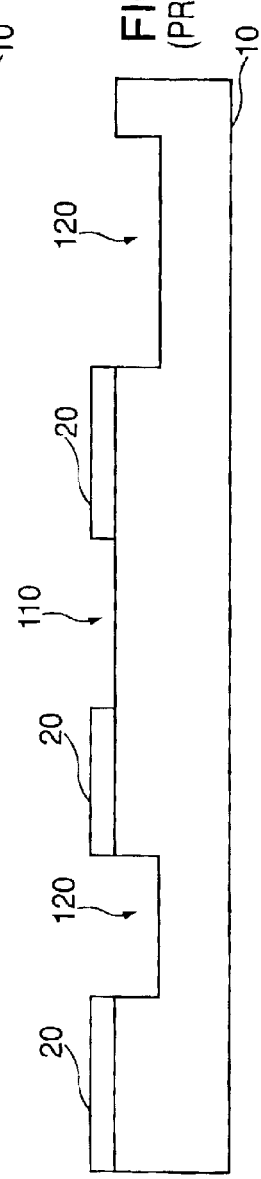
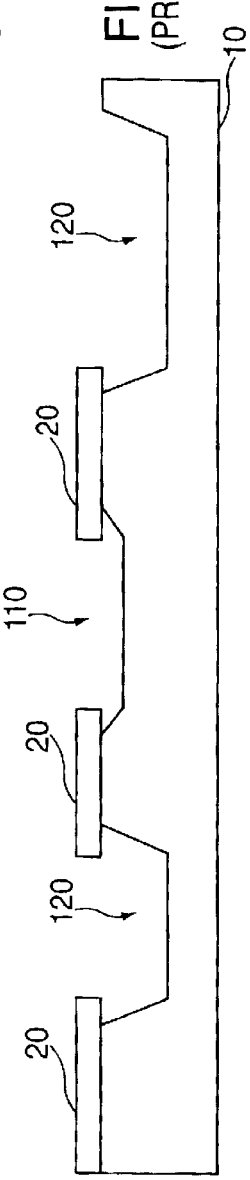

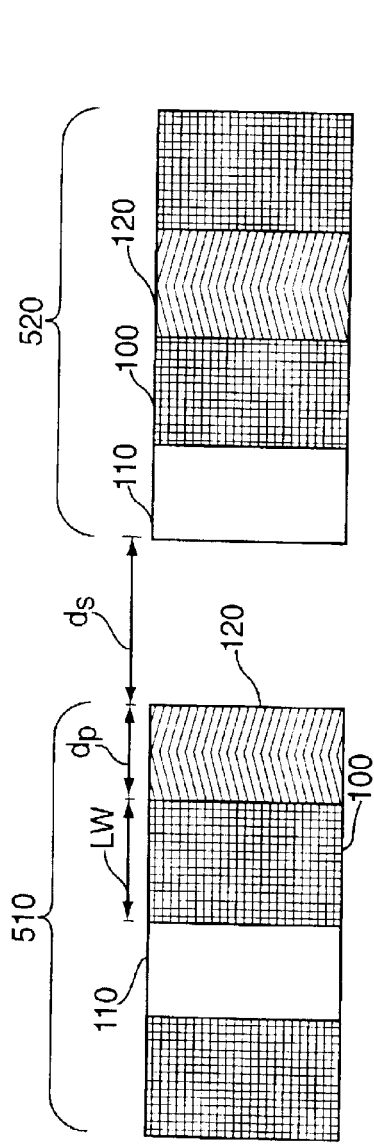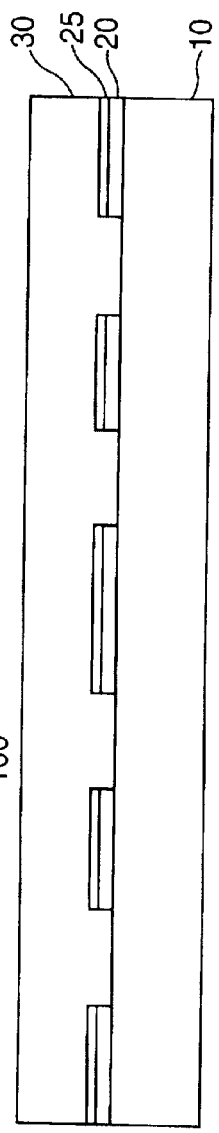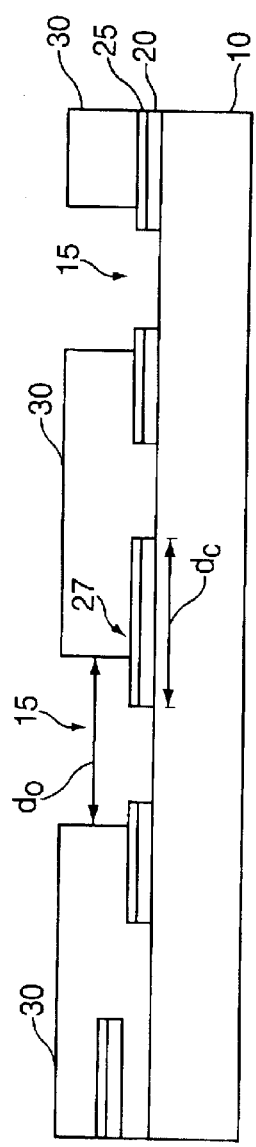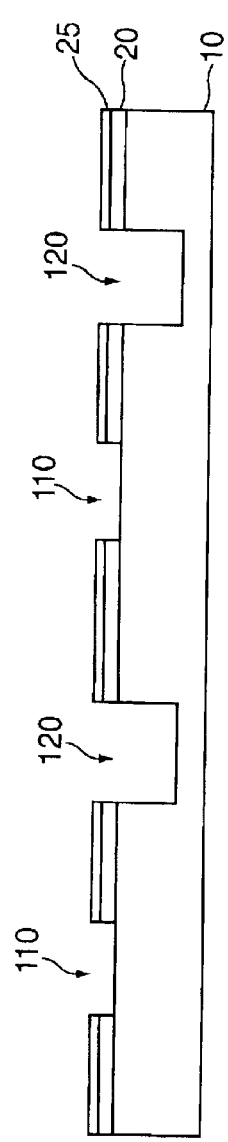
FIG. 5A (PRIOR ART)
FIG. 5B (PRIOR ART)
FIG. 5C (PRIOR ART)
FIG. 5D (PRIOR ART)

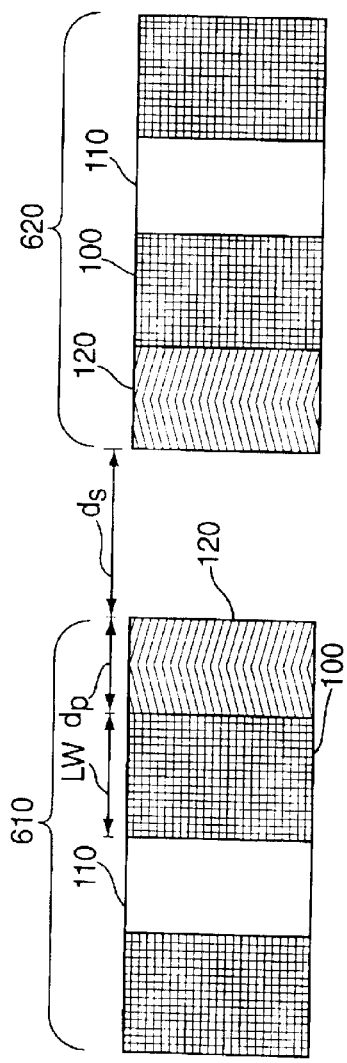
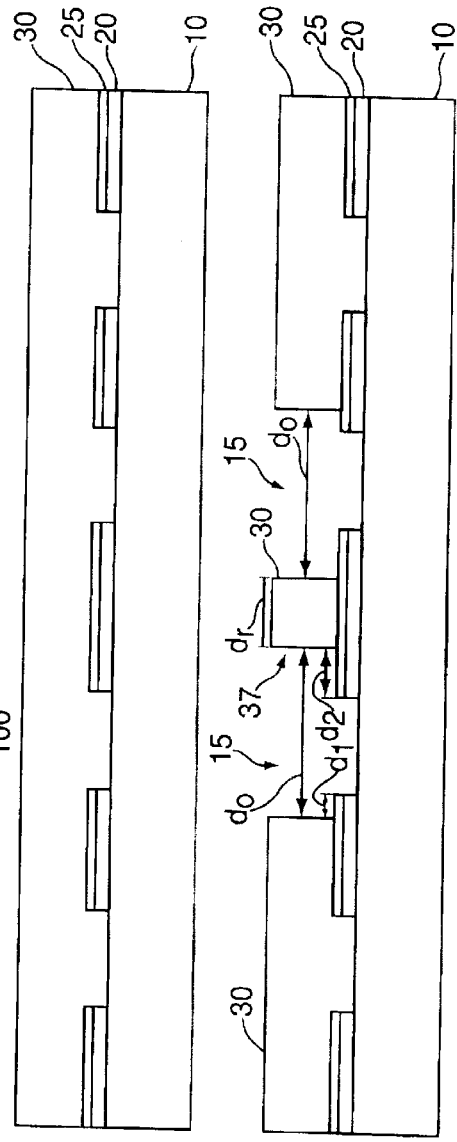
FIG. 6A (PRIOR ART)
FIG. 6B (PRIOR ART)
FIG. 6C (PRIOR ART)
FIG. 6D (PRIOR ART)

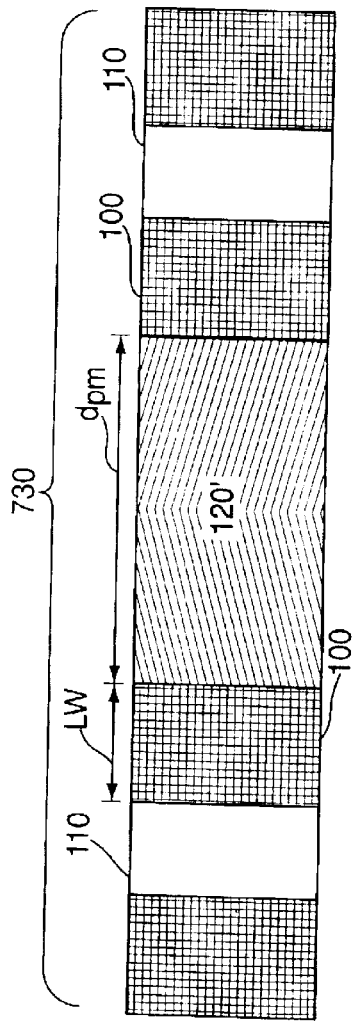
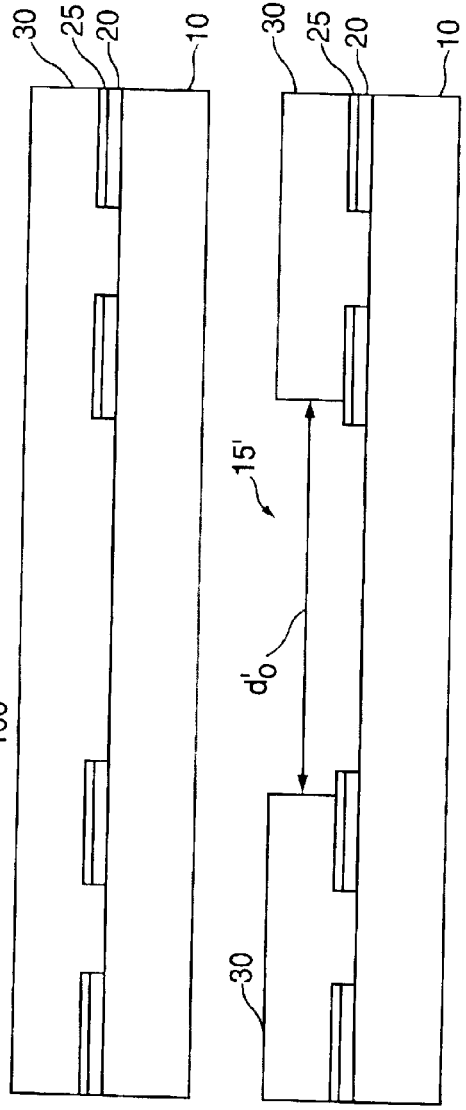
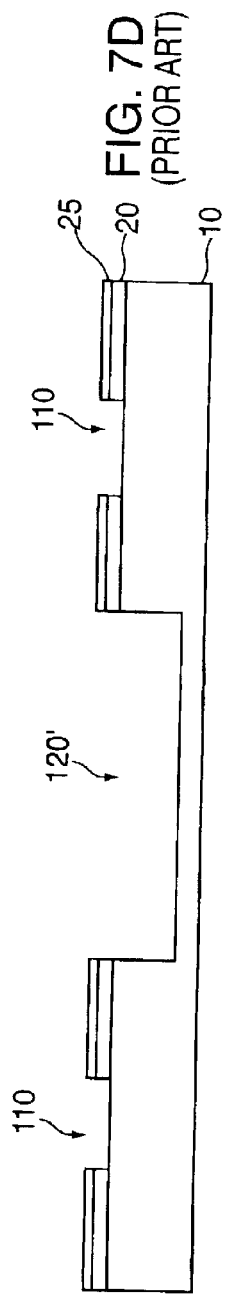
FIG. 7A (PRIOR ART)
FIG. 7B (PRIOR ART)
FIG. 7C (PRIOR ART)
FIG. 7D (PRIOR ART)

PRIORITY COLORING FOR VLSI DESIGNS

CROSS-REFERENCE TO RELATED PATENT APPLICATIONS

This Patent Application is a Divisional Patent Application of and claims, under 35 U.S.C. §120, the benefit of U.S. patent application Ser. No. 09/997,657, filed on Nov. 29, 2001 now U.S. Pat. No. 6,609,245.

FIELD OF THE INVENTION

The present invention relates to the manufacture of very large scale integrated (VLSI) circuit designs and more specifically relates to generating phase shifted mask designs.

BACKGROUND OF THE INVENTION

A very large scale integrated (VLSI) complementary metal oxide semiconductor (CMOS) chip is manufactured on a silicon wafer by a sequence of material additions (i.e., low pressure chemical vapor depositions, sputtering operations, etc.), material removals (i.e., wet etches, reactive ion etches, etc.), and material modifications (i.e., oxidations, ion implants, etc.). These physical and chemical operations interact with the entire wafer. For example, if a wafer is placed into an acid bath, the entire surface of the wafer will be etched away. In order to build very small electrically active devices on the wafer, the impact of these operations has to be confined to small, well defined regions.

Lithography in the context of VLSI manufacturing of CMOS devices is the process of patterning openings in photosensitive polymers (sometimes referred to as photoresists or resists) which define small areas in which the silicon base material is modified by a specific operation in a sequence of processing steps. The manufacturing of CMOS chips involves the repeated patterning of photoresist, followed by an etch, implant, deposition, or other operation, and ending with the removal of the expended photoresist to make way for the new resist to be applied for another iteration of this process sequence.

The basic lithography system consists of a light source, a stencil or photo mask containing the pattern to be transferred to the wafer, a collection of lenses, and a means for aligning existing patterns on the wafer with patterns on the mask. The aligning may take place in an aligning step or steps and may be carried out with an aligning apparatus. Since a wafer containing from 50 to 100 chips is patterned in steps of 1 to 4 chips at a time, these lithography tools are commonly referred to as steppers. The resolution, R, of an optical projection system such as a lithography stepper is limited by parameters described in Raleigh's equation:

$R=k\lambda/NA,$ where $\lambda$ represents the wavelength of the light source used in the projection system and NA represents the numerical aperture of the projection optics used. "k" represents a factor describing how well a combined lithography system can utilize the theoretical resolution limit in practice and can range from about 0.8 down to about 0.5 for standard exposure systems. The highest resolution in optical lithography is currently achieved with deep ultra violet (DUV) steppers operating at 248 nm. Wavelengths of 356 nm are also in widespread use and 193 nm wavelength lithography is becoming commonplace.

Conventional photo masks consist of chromium patterns on a quartz plate, allowing light to pass wherever the chromium has been removed from the mask. Light of a specific wavelength is projected through the mask onto the photoresist coated wafer, exposing the resist wherever hole patterns are placed on the mask. Exposing the resist to light of the appropriate wavelength causes modifications in the molecular structure of the resist polymers which, in common applications, allow a developer to dissolve and remove the resist in the exposed areas. Such resist materials are known as positive resists. (Negative resist systems allow only unexposed resist to be developed away.) The photo masks, when illuminated, can be pictured as an array of individual, infinitely small light sources which can be either turned on (points in clear areas) or turned off (points covered by chrome). If the amplitude of the electric field vector which describes the light radiated by these individual light sources is mapped across a cross section of the mask, a step function will be plotted reflecting the two possible states that each point on the mask can be found (light on, light off).

These conventional photo masks are commonly referred to as chrome on glass (COG) binary masks, due to the binary nature of the image amplitude. The perfectly square step function of the light amplitude exists only in the theoretical limit of the exact mask plane. At any given distance away from the mask, such as in the wafer plane, diffraction effects will cause images to exhibit a finite image slope. At small dimensions, that is, when the size and spacing of the images to be printed are small relative to the $\lambda/NA$, electric field vectors of adjacent images will interact and add constructively. The resulting light intensity curve between the image features is not completely dark, but exhibits significant amounts of light intensity created by the interaction of adjacent features. The resolution of an exposure system is limited by the contrast of the projected image, that is, the intensity difference between adjacent light and dark image features. An increase in the light intensity in nominally dark regions will eventually cause adjacent features to print as one combined structure rather than discrete images.

The quality with which small images can be replicated in lithography depends largely on the available process window; that is, that amount of allowable dose and focus variation that still results in correct image size. Phase shifted mask (PSM) lithography improves the lithographic process window or allows operation at a lower k value by introducing a third parameter on the mask. The electric field vector, like any vector quantity, has a magnitude and direction, so, in addition to turning the electric field amplitude on and off, it can be turned on with a phase of about 0° or turned on with a phase of about 180°. This phase variation is achieved in PSMs by modifying the length that a light beam travels through the mask material. By recessing the mask to an appropriate depth, light traversing the thinner portion of the mask and light traversing the thicker portion of the masks will be 180° out of phase, that is, their electric field vector will be of equal magnitude but point in exactly the opposite direction so that any interaction between these light beams result in perfect cancellation. However, because the 180° phase transition forces a minimum in the image intensity, narrow dark lines will be printed. These unwanted residual phase images are erased using a trim mask, which is a second mask that transmits light only in regions left unexposed by the residual phase edge.

Alternating Phase Shifted Mask (altPSM) lithography is a resolution enhancement technique that is rapidly gaining acceptance as a viable solution to meet aggressive integrated circuit (IC) technology scaling time-lines. Delays in next generation optical and non-optical lithography tooling add vital importance to successful implementation of altPSM. AltPSM takes advantage of destructive interference of light to double the achievable resolution of an optical lithography system. The light interference is created by selectively manipulating the topography of the photomask to introduce an appropriate path-length difference in the imaging light. In a typical altPSM design, a circuit element that has a layout dimension that is less than a cutoff dimension is selected for phase shifting. The cutoff dimension is related to the resolution of the lithography system and a layout dimension that is less than this cutoff is referred to hereinafter as a sub-cutoff layout dimension. The design of the altPSM involves disposing phase shifting shapes on opposing sides of the sub-cutoff dimension, where one phase shape is assigned a phase shift that is 180° out of phase from that of the opposing phase shape. Thus, layout decisions must be made regarding the size, spacing, and phase assignment of these phase shapes relative to the layout of circuit elements. This manipulation of the mask topography requires phase information to be added to the circuit layout in the computer-aided design (CAD) system. Key to the successful implementation of altPSM is an efficient electronic design automation (EDA) tool that can convert circuit designs to altPSM layouts with minimal impact to layout design density or design complexity.

FIGS. 1A–1D illustrates typical steps used in an altPSM manufacturing process. FIG. 1A illustrates a standard COG mask including a transparent substrate 10 (e.g. quartz) overlain by opaque regions 20, typically chrome. The opaque regions 20 are formed by depositing a layer of opaque material, such as chrome, over the transparent substrate 10, depositing and patterning a first resist layer (not shown) over the opaque layer, and then etching the opaque layer to form the patterned opaque regions 20. Then a second layer of resist 30 is deposited and patterned to form resist openings 15 corresponding to phase regions to be etched as illustrated in FIG. 1B. Note that the openings 15 in the second resist layer are wider than the openings in the chrome patterns by about ½ the minimum feature width in a self-aligned process. The mask substrate 10 is then etched selective to chrome to a target phase depth, forming the phase regions 120 (typically 180° phase regions), and the second resist layer is removed, resulting in the structure illustrated in FIG. 1C, where the unetched regions 110 are 0° phase regions. An isotropic etch-back of the substrate 10 may be used to compensate for edge shadowing effects, resulting in the final mask structure illustrated in FIG. 1D.

The generation of an altPSM layout requires the addition of phase shapes on opposing sides of layout features that have dimensions smaller than a cutoff dimension (Dcut) related to the resolution of the lithography system, referred to hereinafter as a sub-cutoff layout dimension. For example, FIG. 2 illustrates a schematic of a typical transistor altPSM layout. The transistor feature 100 includes a line having a sub-cutoff layout dimension (LW), which is defined on the altPSM layout with 0° phase region 110 and 180° phase region 120. In addition to being assigned opposite phases, these phase shapes or regions need to obey a variety of lithographic, mask manufacturability, and design rules governing their size and spacings. Some rules are mutually opposing and require careful optimization.

Methods to assign and optimize phases in an altPSM design are known in the art. For example, referring to FIG. 8, after creating an initial circuit layout (Block 901), the design of the altPSM (Block 900) is performed. Critical circuit elements having sub-cutoff layout dimension LW are identified, as indicated in Block 910 of FIG. 8. Phase shapes are defined in association with each critical element (Block 920). Then the phase shapes are legalized according to the various rules as discussed above (Block 930). Next, the appropriate phases are assigned to each phase shape (Block 940), ensuring binary coloring across the entire mask layout. The process of defining portions of the mask as 0° phase regions and other portions as 180° phase regions is generally referred to as phase coloring. Techniques for automatic phase coloring are known. For example, Kim et al. (U.S. Pat. No. 5,883,813) describes a method for automatically assigning binary properties, such as phase coloring, to a network of elements, such as a the elements of a VLSI circuit design, or other networks of elements. In the method of Kim et al., nets are defined to include coupled intrusion pairs of elements. An intrusion pair is defined so that when one element is assigned one of the two binary properties of interest, the second element of the intrusion pair is assigned the other binary property. In the case of an altPSM design layout, the intrusion pairs are phase shapes, where the phase of one shape determines the phase of the other shape within each intrusion pair. The intrusion pairs are shapes that are close enough that light passing through the shapes will interact and affect the image intensity between the shapes. Thus, intrusion pairs that are sufficiently close together will likewise interact and will be coupled together by a "connected" function that defines a net. Nets are defined by intrusion pairs that have common elements assigned according to the "connected" function. As each intrusion pair is assigned to a net, the net is checked for any coloring conflicts or violations of the "connected" function so that all elements assigned to a net satisfy the "connected" function. All intrusion pairs, i.e. phase shapes in the case of an altPSM design, within a net will be colored together such that each element of an intrusion pair is assigned an opposite binary property from its paired element. For example, phase shapes would be assigned alternate phase shifts across each critical element dimension in an altPSM design. The technique of Kim et al. can be applied to both dark-field and light-field PSM designs, and can be adapted to both flat and hierarchical VLSI CAD databases. After the phases have been assigned to the phase shapes within each net in conformance with the "connected" function and other rules, the layout is checked for any inconsistencies or errors (Block 950). If layout conforms with all rules, then the altPSM design is accepted and the associated trim mask is then designed (Block 909). Although it may not be possible to correct all such errors, the layout may be acceptable, even though it might not be optimal. For example, a layout that might otherwise be acceptable could have a narrow process window. In other cases, however, it may be necessary to re-design the circuit layout (Block 960).

The "connected" function that is used to define phase shape intrusion pairs in altPSM designs may be typically expressed by a cutoff dimension for layout widths. If the width of a circuit element in the altPSM layout is smaller than the cutoff dimension, then that feature will be laid out with phase shifting shapes disposed on opposing sides of that feature dimension. This rule thus constrains the design of the mask layout. Other rules may also place additional constraints on the layout, but may be of lesser significance in the mask design or the resulting image, but could nonetheless improve overall quality or reduce costs if the layout conformed to such rules. On the other hand, the violation of some rules in a design could significantly impact the quality of the resulting product and those rules should typically not be violated. Thus, it would be desirable to provide a method that can handle such additional rules while also taking into account the relative importance or priority of the rules.

One example of an additional altPSM design rule is the rule for minimum phase-to-phase spacing. If two phase shapes approach each other to within a given spacing, the space must be eliminated by filling and merging the two phase regions. The problem is illustrated by reference to FIGS. 3–7 and is described in the following discussion. In each of these figures, part A illustrates a top down view of two nets (as defined in Kim et al. described above) of an altPSM layout, and parts B–D illustrate cross-sections of the corresponding mask at three steps in the process of manufacturing the mask. FIG. 3A shows a top down view of two neighboring nets 310 and 320 of an alternating phase shift mask layout, each net including a feature 100 having a sub-cutoff layout dimension LW. Net 310 has a 180° phase region 120 to the left of critical feature 100 and a 0° phase region 110 on the left of feature 100. Net 320 has a 0° phase region on the left and a 180° region on the right of feature 100. Thus, in this example, the two 0° phase regions, each having widths $d_p$, are adjacent to each other, separated by a distance $d_s$ which is larger than LW. The nominal phase widths $d_p$ are typically assigned a predetermined, fixed width. FIG. 3B illustrates the corresponding cross-section of the mask after the patterning and etching of the chrome layer 20 to provide openings corresponding to the transparent phase regions. The mask substrate 10 is commonly quartz. Typically, an anti-reflective coating (ARC) 25 has also been formed over the chrome layer 20 and similarly etched. A second layer of resist 30 is applied, and patterned to form openings 15 in the resist layer 30 to etch the 180° degree phase regions as illustrated in FIG. 3C. Note that each of the openings 15 have a width $d_o$ that is wider than the width $d_p$ of the phase regions 120 in a self-aligned process. For a self-aligned process, if the opening 15 is centered over the 180° phase shape 120, the opening 15 should be wider than the phase shape 120 by a self alignment tolerance distance $d_d$ equal to $d_1$ plus $d_2$, as illustrated in FIG. 6C. Assuming that $d_1$ and $d_2$ are equal, a suitable value for $d_1$ and $d_2$ is about ½ Dcut (the cutoff dimension), so that, assuming that the phase width $d_p$ is equal to about Dcut, the width $d_o$ of the opening 15 will be about 2×Dcut. Although it may be convenient to set the self alignment tolerance $d_d$ (the sum of $d_1$ plus $d_2$) and the phase width $d_p$ equal to Dcut, other values for $d_d$ and $d_p$ may be selected according to design requirements. The quartz substrate 10 is then etched selective to chrome, and the resist is removed, resulting in the mask structure of FIG. 3D having a 180° phase regions 120 and 0° phase regions 110. As long as the width $d_c$ of the chrome feature 27 is larger than or equal to a minimum distance, $d_{cmin}$, this mask is manufacturable.

However, if the distance, for example $d_s$ between nets 410 and 420 as illustrated in FIG. 4A, between like phase regions of neighboring nets becomes smaller than a minimum distance $d_{cmin}$, the narrow chrome lines such as feature 27' having width $d_c$ smaller than $d_{cmin}$ are difficult to manufacture reliably. For high resolution processes, where Dcut is close to the mask process resolution limit, the minimum width $d_{cmin}$ of chrome lines that can be manufactured is in the range about 0.5–0.8×Dcut, and typically about 0.7×Dcut. The typical solution is to merge phase regions that are closely spaced to form one large phase region 110 having a width $d_M$ as illustrated in FIG. 4C. The process of ensuring that phase regions meet chrome manufacturability rules is part of the step 930 of legalizing phase shapes in conventional methods for designing altPSM layouts as illustrated in FIG. 8.

After the step of legalizing phase shapes (Block 930), a conventional altPSM design flow proceeds to a step of assigning phase shift (Block 940) to the phase shapes. In this step, the assignment of phases are constrained by an additional manufacturability constraint that can complicate the design process. The phase shift regions are formed on the mask by a patterned etch. The manufacturability of these phase regions is partly constrained by the manufacturability of resist features formed in the patterning of the phase shift regions. This problem can be better understood by reference to FIGS. 5, 6 and 7.

FIG. 5A illustrates the case of a net 510 having a 180° degree region 120 which adjacent to a 0° degree phase region 110 of a neighboring net 520 separated by a distance $d_s$. Typically, such a phase coloring is not a problem because a mask as illustrated in FIG. 5D having an etched phase region adjacent to an unetched phase region does not tend to cause manufacturability problems as long as the separation distance $d_s$ is equal to or larger than the minimum width $d_{cmin}$ (between about 0.5–0.8×Dcut, and typically 0.7×Dcut) so that the chrome feature 27 has a width dc greater than $d_{cmin}$ as discussed above.

However, a manufacturability problem can occur in the case where there are two 180° degree phase regions adjacent to each other. Referring to FIG. 6A, two neighboring nets 610 and 620 are phase colored such that corresponding 180° degree phase regions 120 are adjacent to each other, separated by a distance $d_s$. FIG. 6B illustrates the cross-section after the second resist layer 30 has been applied. A problem arises at the step of forming resist openings 15 for etching the 180° degree phase regions 120. The width $d_o$ of the resist openings 15 are larger than the width $d_p$ of the desired 180° degree phase regions 120 for self-alignment purposes by a combined self-alignment tolerance distance of $dt=d_1+d_2$. If the opening 15 is centered on the phase shape 120, then typically $d_1$ and $d_2$ are chosen to be about 0.5×Dcut, and dt=Dcut, which results in a resist opening 15 having width of $d_o=d_p$+Dcut. However, this can lead to the formation of a resist feature 37 that has a small width $d_r$ that is smaller than a minimum resist width Rmin that is difficult to manufacture and causes inspection problems. Rmin may be in the range from about 0.5–0.8×Dcut, and is typically about 0.7×Dcut. This means that the distance $d_s$ between two adjacent 180° phase shapes must be wider than a minimum distance dpmin of about dt+Rmin, or typically dpmin is about 1.7×Dcut. The conventional solution to the situation where $d_s$ is less than dpmin is to merge the adjacent 180° degree phase regions 120 of FIG. 6A into one large 180° degree phase region 120' having a width $d_{pM}$ as illustrated in FIG. 7A. Note that the nets 610 and 620 are now effectively merged into a combined net 730. A self-aligned resist opening 15' is formed having a width $d_0$'=dpmin+dt and the substrate is etched to form the merged 180° phase region 120', resulting in the altPSM cross-section section illustrated in FIG. 7D.

Note that the minimum 180°—180° distance dpmin (about 1.7×Dcut) to ensure resist manufacturability is larger than the minimum 0°–0° spacing distance $d_{cmin}$ (about 0.7×Dcut) required to ensure chrome manufacturability as discussed above. One way to enforce the minimum 180°—180° distance dpmin is to require that all adjacent net phases meet the dpmin requirement in legalization step 930 of FIG. 8. However, because dpmin is significantly larger than $d_{cmin}$, this can significantly impact the design of the mask layout and alter the density of the design. Since phase assignments conventionally occur in a subsequent step 940 after an initial legalization step 930, the enforcement of the minimum 180°—180° phase spacing distance dpmin or a merger of adjacent 180°—180° phase shapes would require additional iterations of steps 920 and 930 and increase the complexity in the design process flow of an altPSM layout.

Many other design rules can be found that constrain the design with different degrees of impact on the design.

In view of the foregoing discussion, there is a need to provide for a method for designing an alternating phase shifted mask (altPSM) that accounts for multiple design rules that may have differing impact on the design and differing degrees of importance or priority with respect to the acceptability of the design. For example, a design criterion that avoids adjacent etched phase shapes (for example, the 180°—180° phase regions) having spacings that violate mask manufacturability rules is desirable because it maximizes layout density and minimizes the complexity in the design process flow, but such a rule will typically have a lower design priority than the rules governing the image resolution of critical circuit elements. There is also a need to implement a method that incorporates rules having differing priorities into existing software methodologies for designing altPSM layouts.

SUMMARY OF THE INVENTION

The present invention addresses the above-described need by providing a method for optimizing the design of an alternating phase shifted mask (altPSM) that assigns phase shapes and phase coloring according to a hierarchical set of rules or relationships. More generally, the present invention provides a method for automatically assigning binary properties to the elements of a very large semiconductor integrated (VLSI) circuit design layout according to a prioritized set of rules.

In a preferred embodiment, the present invention addresses the above-described need by providing a method for optimizing the design of an alternating phase shifted mask (altPSM) so that manufacturability constraints are met.

It is the further object of the present invention to provide a method for optimizing the design of an alternating phase shifted mask (altPSM) so that an additional set of design rules, such as manufacturability constraints, are met without significantly impacting layout density.

This invention has the further objective of providing a method of optimizing the design of an altPSM that incorporates additional design constraints, such as ensuring mask manufacturability, without significantly increasing the complexity of the altPSM design flow.

In accordance with one aspect of the present invention, a method is provided for assigning binary properties to elements of a VLSI circuit or network layout according to a set of rules having differing priorities and assigning the binary properties in a hierarchical manner from the highest to lowest priority rules. The method defines intrusion pairs of layout elements according to sets of rules, functions, or relationships in decreasing priority order. Intrusion pairs and net coloring according to lower priority rules are defined as long as higher priority rules are not violated. Violations of lower priority rules may be allowed in preference to higher priority rules. The method is applicable for generating alternating phase shift mask (altPSM) designs from VLSI CAD datasets.

In accordance with one aspect of the present invention, a method for designing an alternating phase shifting mask (altPSM) includes identifying critical elements of a circuit layout having a sub-cutoff dimensions, generating an initial set of phase shapes disposed on opposing sides of each sub-cutoff dimension, legalizing the phase shapes in accordance with chrome manufacturability criteria, including merging adjacent phase shapes where chrome lines would violate the manufacturability criteria, assigning phase shifts to the legalized phase shapes, and then ensuring that there are no spacings between etched phase shapes of neighboring nets (e.g. 80° phase assignments) that have spacing less than an etching manufacturability constraint. In accordance with the present invention, if such spacings exist, the solution is to reverse the phase colorings in the adjacent net so that the 180°— 180° spacing violation no longer occurs.

In accordance with another aspect of the present invention, the etching manufacturability constraint includes a minimum resist width, and further includes the case where the minimum resist width is about 0.5–0.8 times a cutoff dimension, where the cutoff dimension is the maximum layout dimension that requires phase shifting.

In accordance with another aspect of the present invention, the etching manufacturability constraint includes a requirement that the first net edge and the second net edge be separated by a distance greater than the sum of an etching alignment tolerance and a minimum resist width. The method includes the case where the etching alignment tolerance is about the cutoff dimension and the case where the minimum resist width is about 0.5–0.8×the cutoff dimension.

According to another aspect of the current invention, a computer program product is described for performing the generalized coloring method and for an embodiment of the method as described above for designing an alternating phase shifting mask (altPSM) and which can be incorporated as a module within existing computer programs for designing altPSM layouts.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

BRIEF DESCRIPTION OF THE DRAWINGS

FIGS. 1A–1D illustrates cross-sectional views of an alternating phase shifted mask (altPSM) at sequential stages of manufacturing.

FIG. 5A illustrates a prior art plan view of a layout of an altPSM including two nets with adjacent phase shapes, one having a 0° phase assignment and the other having a 180° phase assignment, where the adjacent phase shapes are separated by a background space of width $d_s$.

FIGS. 5B–5D illustrates cross-sectional views of the altPSM of FIG. 5A at sequential stages of processing.

FIG. 6A illustrates a prior art plan view of a layout of an altPSM including two nets with adjacent phase shapes each having 180° phase assignments, where the adjacent phase shapes are separated by a background space of width $d_s$.

FIGS. 6B–6D illustrates cross-sectional views of the altPSM of FIG. 6A at sequential stages of processing.

FIG. 7A illustrates a prior art plan view of a layout of an altPSM after modification of the layout in FIG. 6A by merging the adjacent 180° phase shapes with the filled background space.

FIGS. 7B–7D illustrates cross-sectional views of the altPSM of FIG. 7A at sequential stages of processing.

DESCRIPTION OF THE PREFERRED EMBODIMENTS

Figure 2:
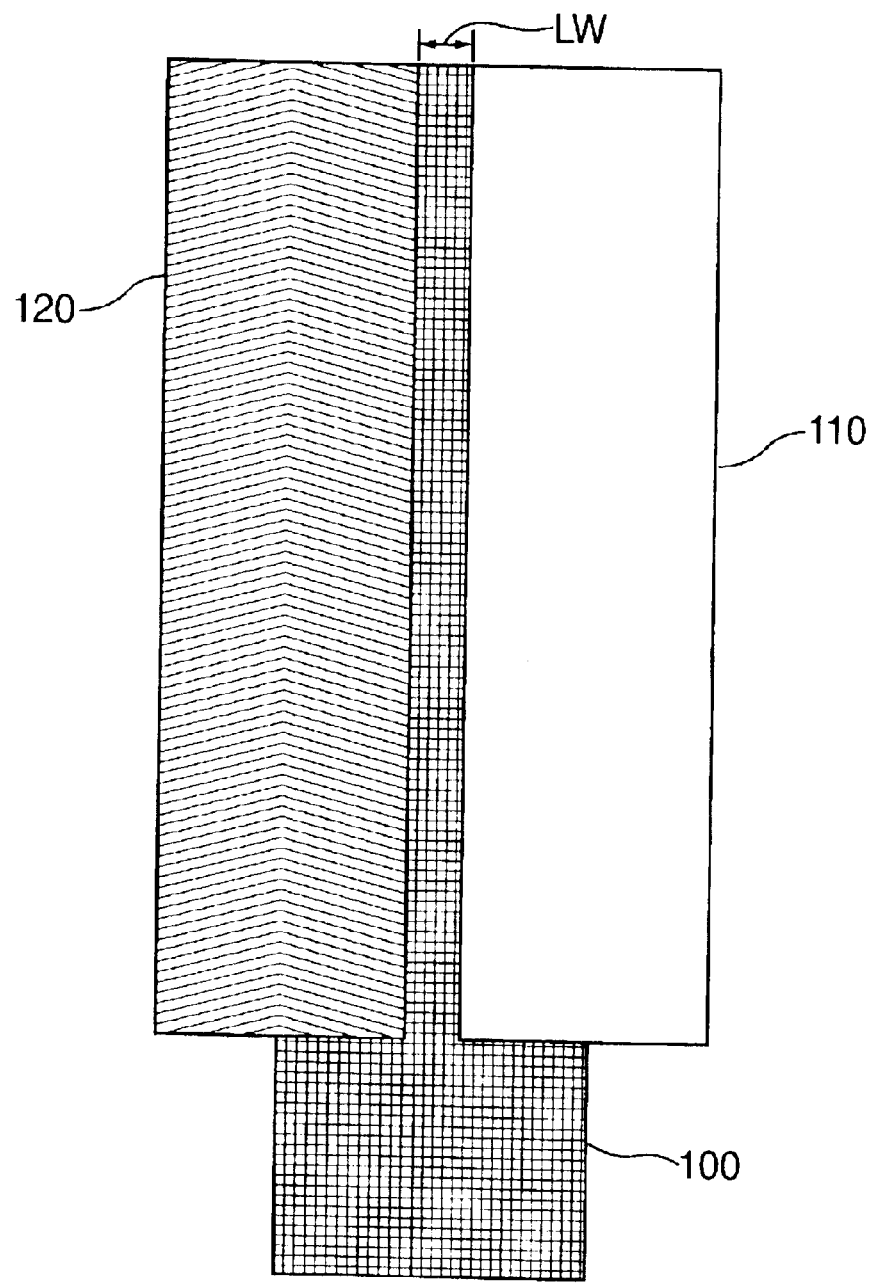
FIG. 2 illustrates an example of an plan view of a typical altPSM layout for a circuit element.
Figure 3A:
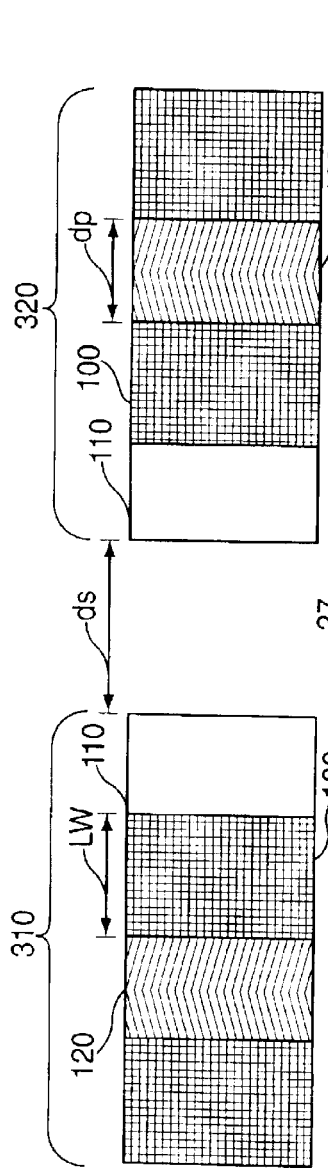
FIG. 3A illustrates a prior art plan view of a layout of an altPSM including two nets with adjacent phase shapes each having 0° phase assignments, where the adjacent phase shapes are separated by a background space of width $d_s$.
Figure 3B:
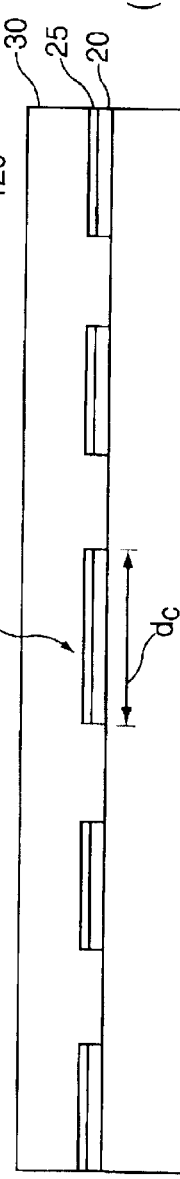
FIGS. 3B–3D illustrates cross-sectional views of the altPSM of FIG. 3A at sequential stages of processing.
Figure 3C:
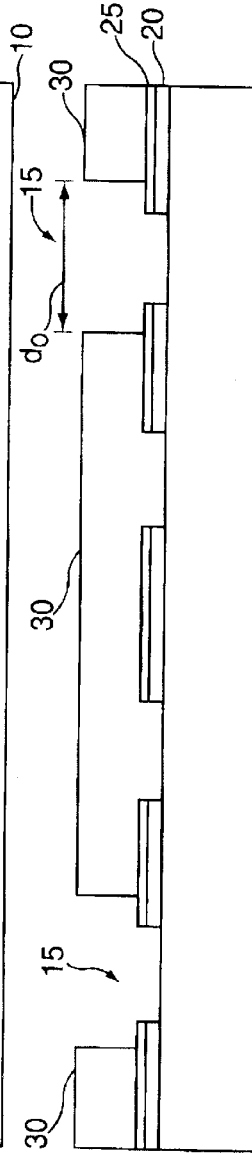
Figure 3D:
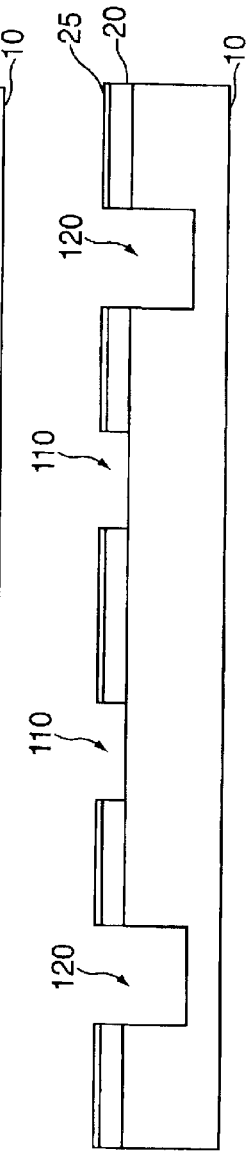
Figure 4A:
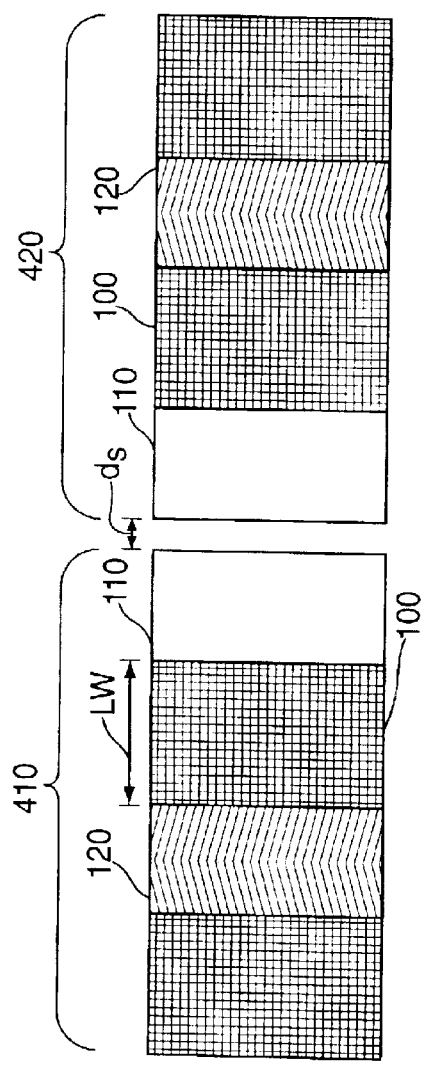
FIG. 4A illustrates a prior art plan view of a layout of an altPSM including two nets with adjacent phase shapes each having 0° phase assignments, where the adjacent phase shapes are separated by a background space of narrow width $d_s$.
Figure 4B:
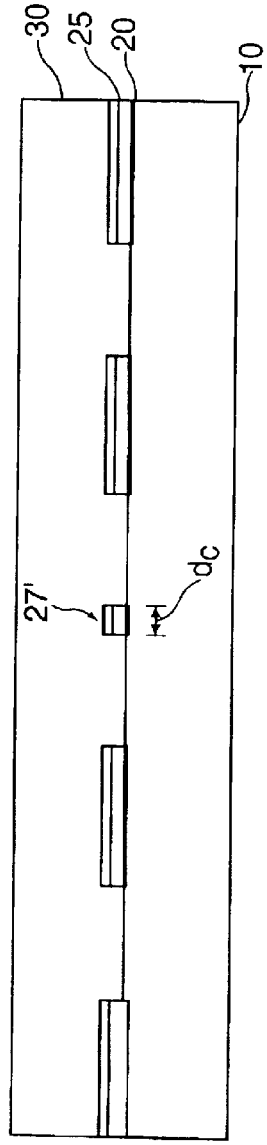
FIG. 4B illustrates a cross-section of the altPSM of FIG. 4A at an intermediate processing stage having a narrow chrome feature of width $d_c$.
Figure 4C:
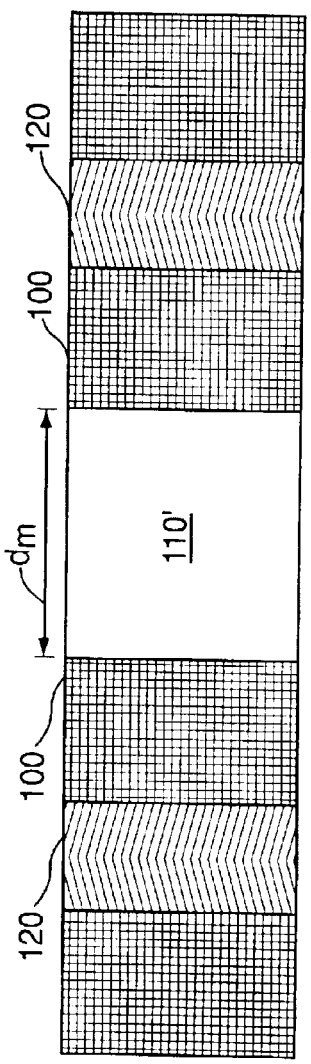
FIG. 4C illustrates an plan view of the altPSM of FIG. 4A after merging the adjacent 0° phase shapes with the filled background space.

In the following descriptions of the preferred embodiments of the invention, a method for optimizing the assignment of binary properties of a VLSI circuit design is described. A preferred embodiment of the method as applied to an altPSM layout is provided to minimize manufacturability problems. It will be appreciated that this is intended as an example only, and that the invention may be practiced under a variety of conditions and using a variety of layouts and design constraints.

As discussed above, Kim et al. discloses a method of assigning binary properties to a network of elements, such as a VLSI circuit layout, by defining nets of intrusion pairs, where an intrusion pair is defined according to a "connected" function. A "connected" function may be any rule, mathematical function, or other relationship that defines an intrusion pair of elements of a network or circuit layout. Accordingly, function, rule, or relationship is being used interchangeably throughout the description of the invention to mean any relationship that potentially defines an intrusion pair. The present invention provides a method for optimally assigning binary properties to elements of a VLSI circuit layout according to hierarchy of "connected" functions or rules, where there are differing priorities assigned to the rules, and nets of intrusion pairs are first defined and colored according to the highest priority rules, followed by net assignment and coloring according to the next highest priority rules, and so on. According to the present invention, a violation of rules having lower priority may result in a design layout that is not optimal, but may be acceptable as long as higher priority rules are not violated. The method can be best understood by reference to a specific embodiment described below.

In accordance with the present invention, one embodiment for designing an altPSM is illustrated with reference to FIG. 9, using the example of a dark field altPSM. The method of the present invention would be preferably used after an initial assignment of phase coloring to nets as for example step 940 of FIG. 8. Although the present embodiment is not restricted to phase assignments of 0° and 180°, these phase assignments are commonly used in altPSM designs. FIG. 9 illustrates a flow chart describing an embodiment of the method in accordance with the present invention. After an initial assignment of phases according to a first set of rules, such as defining assignment of phase shapes according to a cutoff dimension, as in block 940, in accordance with the present invention, block 945 describes a method for checking and modifying the phase assignments based on a second, lower priority, set of rules. In the case of an altPSM design, for example, the second rule may include identifying adjacent nets having adjacent phase shapes to be etched, e.g. 180° phase regions (Block 1010). Then, in cases where the width of the space between adjacent etched phase shapes is too close, an intrusion pair is formed based on this (second) set of rules to comply with manufacturability constraints and a combined net is formed based on these rules (Block 1020). The combined net must be re-colored so that all intrusion pairs conform to at least the first set of rules. This can be done by simply reversing all the coloring in one of the previously colored adjacent nets. A check for conflicts will typically be performed after the intrusion pair is formed according to the second set of rules (Block 1025). Then another net pair is checked for the possible intrusion pairs according to the second rules set (Block 1030) until all net pairs have been checked. The method as illustrated in Block 945 could be implemented in computer instructions that can be incorporated as a module into existing altPSM design software, such as that described in U.S. Pat. No. 5,537,648 and U.S. Pat. No. 5,636,131 (Liebmann et al.) and U.S. Pat. No. 6,057,063 (Liebmann et al.).

Figure 10:
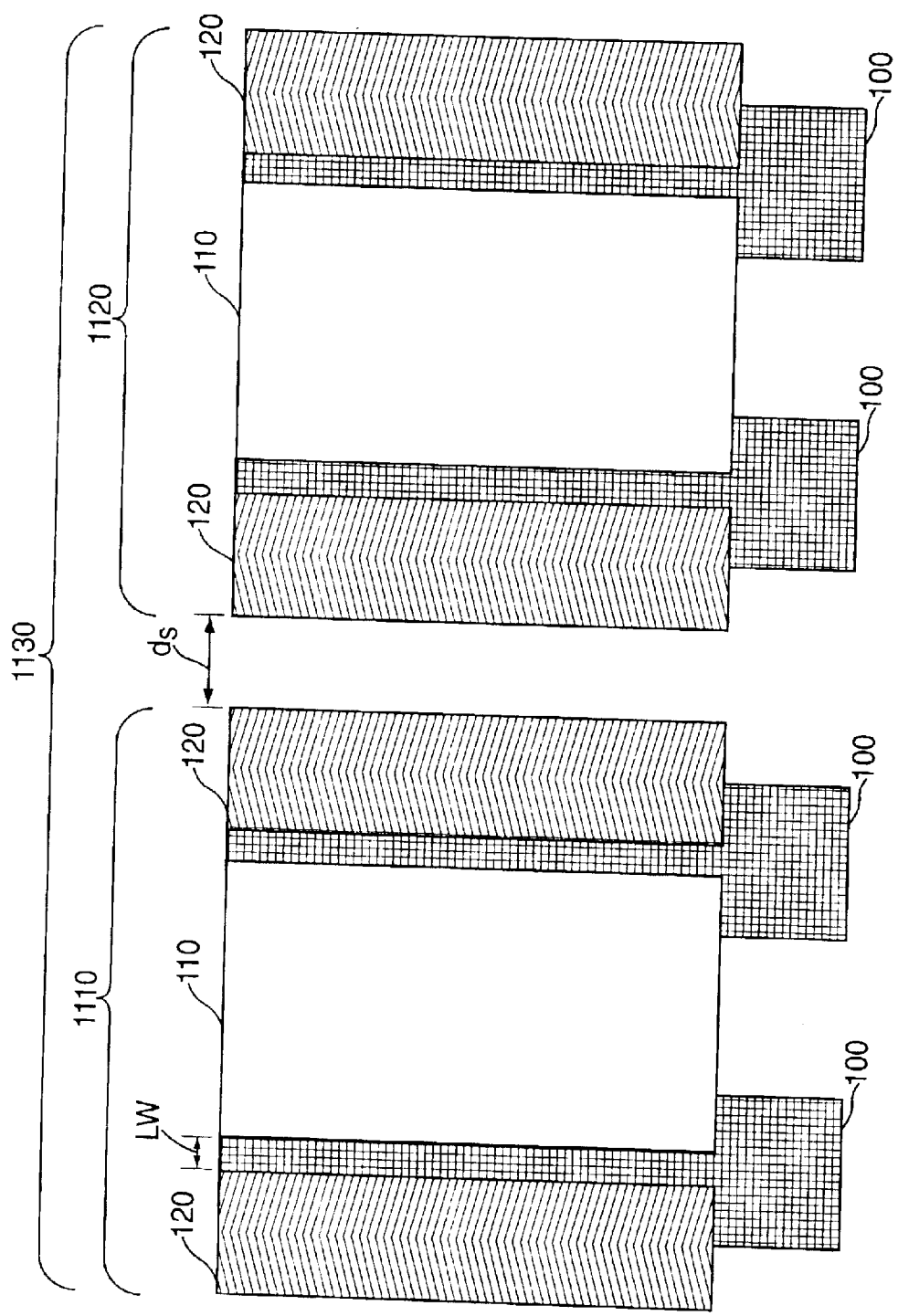
FIG. 10 illustrates two adjacent nets in an altPSM layout having adjacent phase shapes both having 180° phase assignments and the formation of a third net comprising the two adjacent nets in accordance with the present invention.
Figure 11:
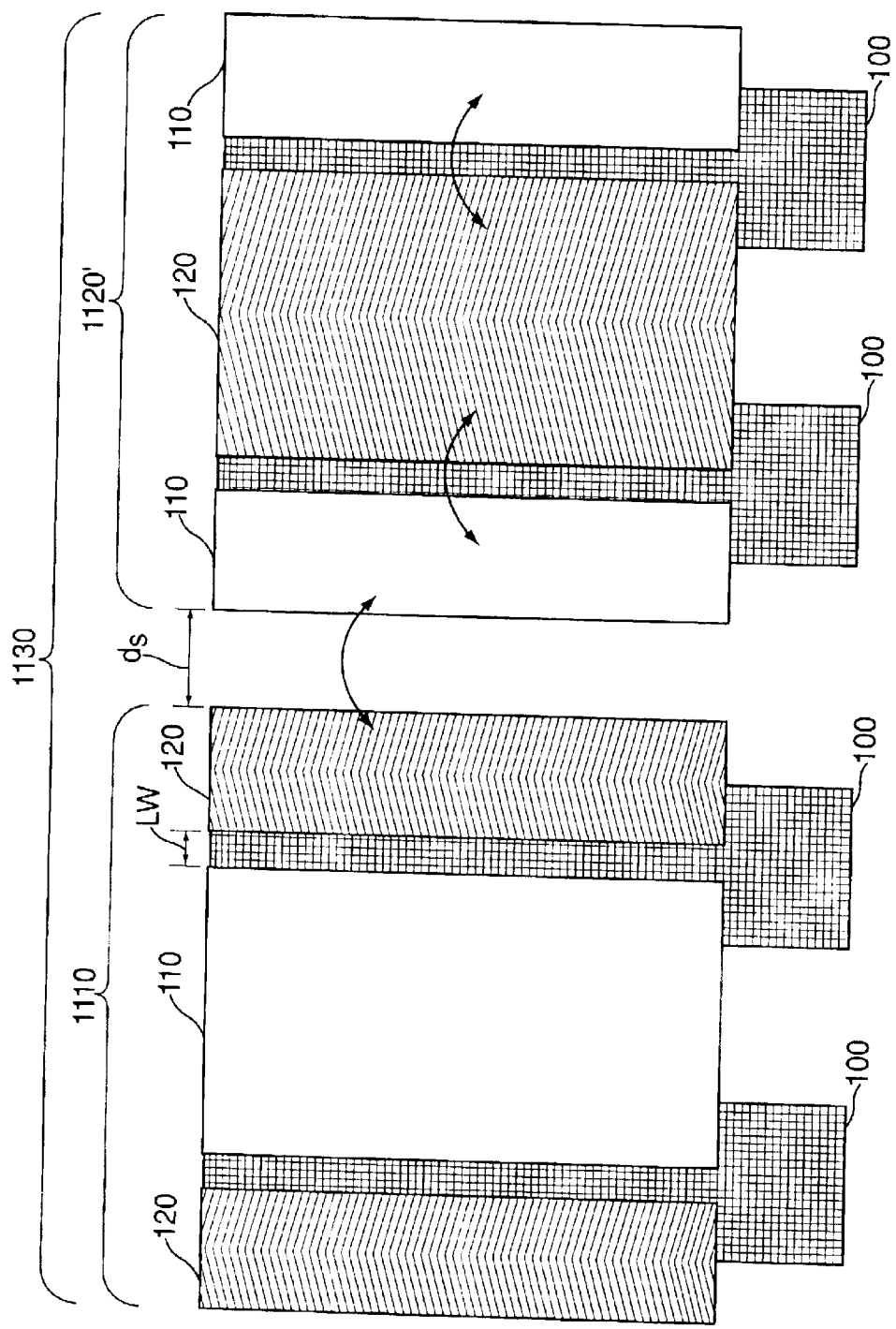
FIG. 11 illustrates the process of reversing the phase assignments in one of the adjacent nets from FIG. 10 within the combined net in accordance with the present invention.

In accordance with the present invention, an embodiment of the method for the case of an altPSM design involves, for each net, identifying an adjacent net, and determining if the adjacent nets have adjacent like-colored phase shapes requiring etching (e.g. 180° phase shapes) that are separated by a spacing $d_s$ (Block 1010). There may be a self-alignment tolerance distance of $dt=d_{1+d2}$ as described above in reference to FIG. 6, so that the width $d_o$ of the opening 15 is equal to about the width $d_p$ of the 180° phase shape plus dt. Also, given a minimum resist width Rmin that is required for manufacturability and/or inspectability, then the minimum spacing Wmin between adjacent 180° phase shapes is Wmin=Rmin+dt. In accordance with the present invention, if the spacing $d_s$ is less than the minimum width Wmin, then the two adjacent nets (for example, 1110 and 1120 of FIG. 10) are linked together by a new "connectedness" function to form a new linked net 1130. All of the phase regions within the new linked net 1130 will now be recolored, for example, by reversing the phase assignments of net 1120 (FIG. 10) to form net 1120' (FIG. 11). Then additional net pairs are checked for other adjacent etched (e.g. 180°) phase shapes, where net 1130 now forms a single net within the layout.

Figure 8:
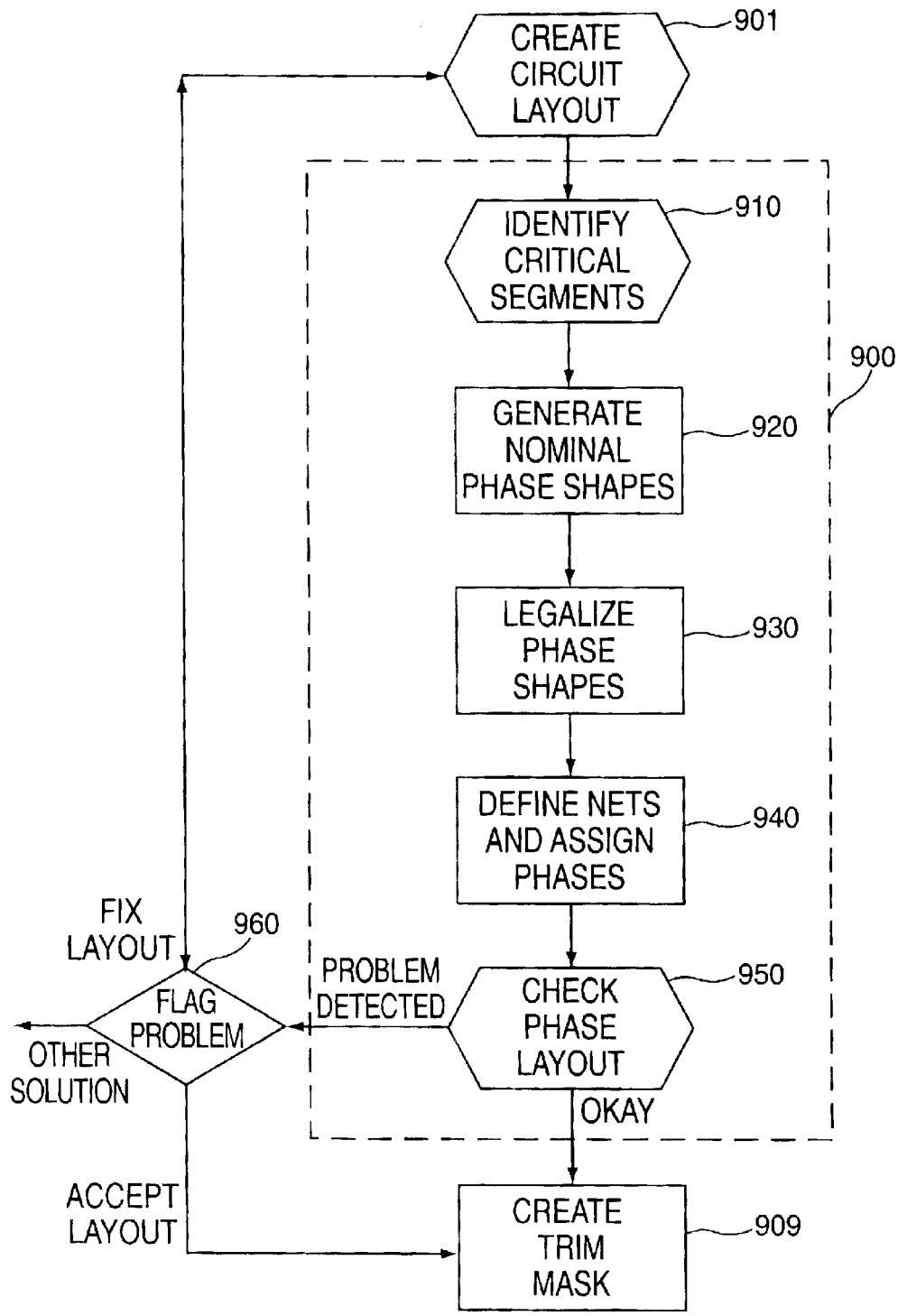
FIG. 8 illustrates a prior art flow chart for a method or computer program product for optimizing an altPSM layout.
Figure 9:
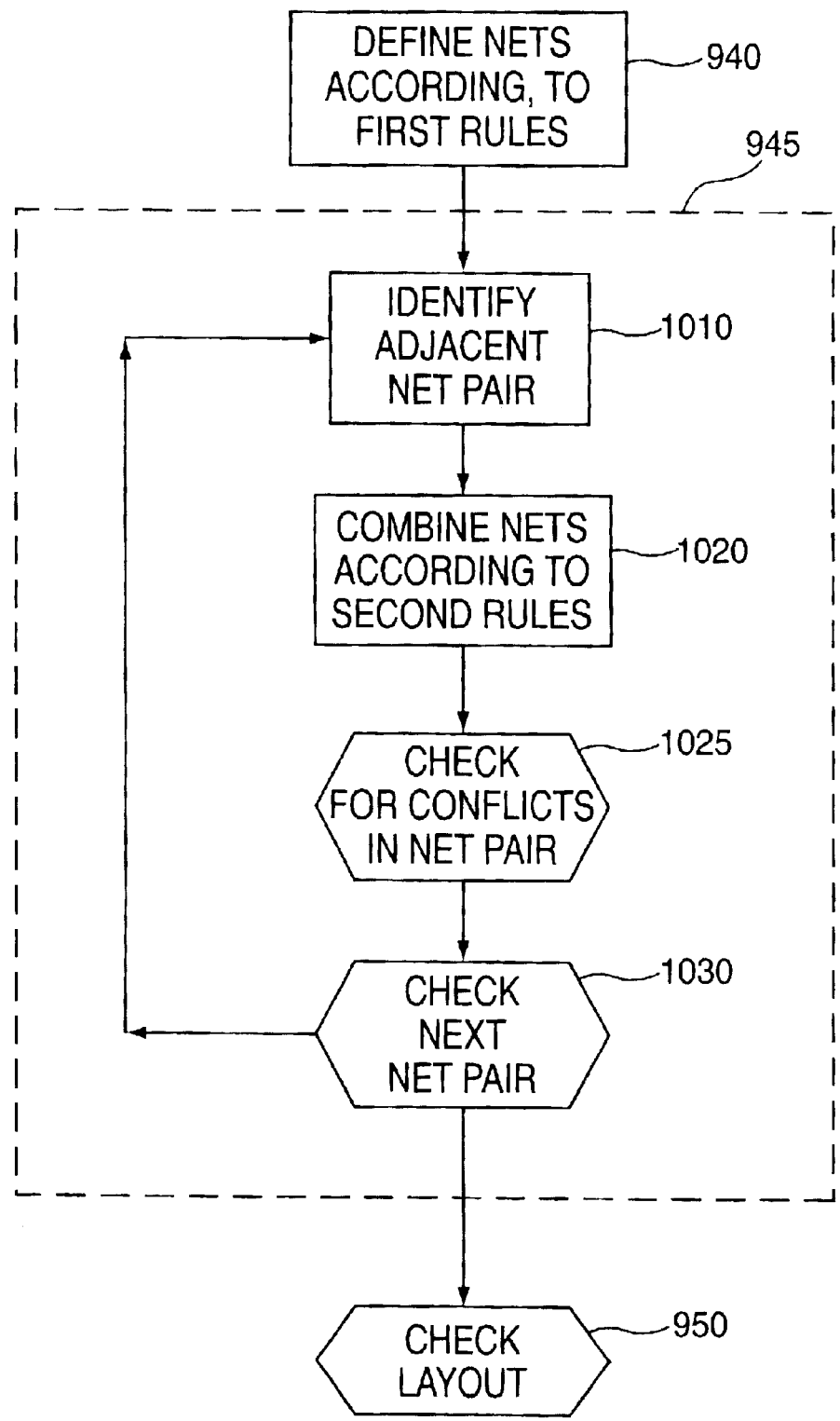
FIG. 9 illustrates a flow chart of a method or computer program product implemented in accordance with the present invention.

When all of the net pairs are checked, then entire layout must be checked for layout errors as before (Block 950 in FIG. 9 and FIG. 8). Any errors will be flagged (see Block 960 in FIG. 8) and at that point a decision must be made for handling the problem. In some cases, it may be acceptable to merge adjacent 180°—180° phase shapes. Alternatively, the conflicts and errors may not be resolvable, and a new circuit layout may be required. In addition, other problems could be identified requiring other solutions. This embodiment is not limited to dark field altPSM design, but could also apply and be adapted to light field altPSM design. Similarly, the invention is not limited to the case of 0° and 180° phase regions, but could include any set of phase regions where various degrees of mask etching are required.

The embodiment described above can be generalized for any set of "connected" functions, rules, or relationships that would be appropriate for defining intrusion pairs in a VLSI design layout. The generalized method according to the present invention for assigning a binary property to circuit elements, can be summarized as comprising:

providing a circuit design having elements;

providing a first rule (R1) set for defining an R1 intrusion pair comprising a first R1 element and a second R1 element that intrude according to said first rule set;

forming a plurality of first nets wherein each of said first nets comprise R1 intrusion pairs in accordance with said first rule set;

coloring each of said first nets so that said first R1 element and said second R1 element have opposite binary properties for all R1 intrusion pairs within a given one of said first nets;

providing a second rule (R2) set for defining an R2 intrusion pair comprising a first R2 element and a second R2 element that intrude according to said second rule set and wherein said second rule set has a lower priority than said first rule set;

forming at least one second net comprising an R2 intrusion pair wherein said first R2 element is contained in one of said first nets and said second R2 element is contained in a second of said first nets; and coloring said second of said first nets so that said second R2 element has an opposite binary property from said first R2 element and each of said first R1 elements and said second R1 elements have opposite binary properties for all R1 intrusion pairs within said at least one second net.

The generalized method of the present invention can further comprise:

providing at least one additional rule (Ra) for defining an Ra intrusion pair having a first Ra element and a second Ra element that intrude according to said at least one additional rule, wherein each of said at least one additional have a lower priority than said second rule set; and forming, in decreasing priority order of rule sets, at least one additional net comprising an Ra intrusion pair wherein said first Ra element is contained in one of said nets formed in accordance with a rule set having a higher priority than said at least one additional rule set and wherein said second Ra element is contained in a different one of said nets formed in accordance with a rule set having a higher priority than said at least one additional rule set; and coloring said at least one additional net so that said second Ra element has an opposite binary property from said first Ra element without violating any of said rule sets having a higher priority than said at least one additional rule set.

This generalized method is suitable for implementation in a computer program product that can be incorporated as modules into existing computer program products for designing VLSI layouts such as altPSM designs or other circuit designs.

Figure 12:
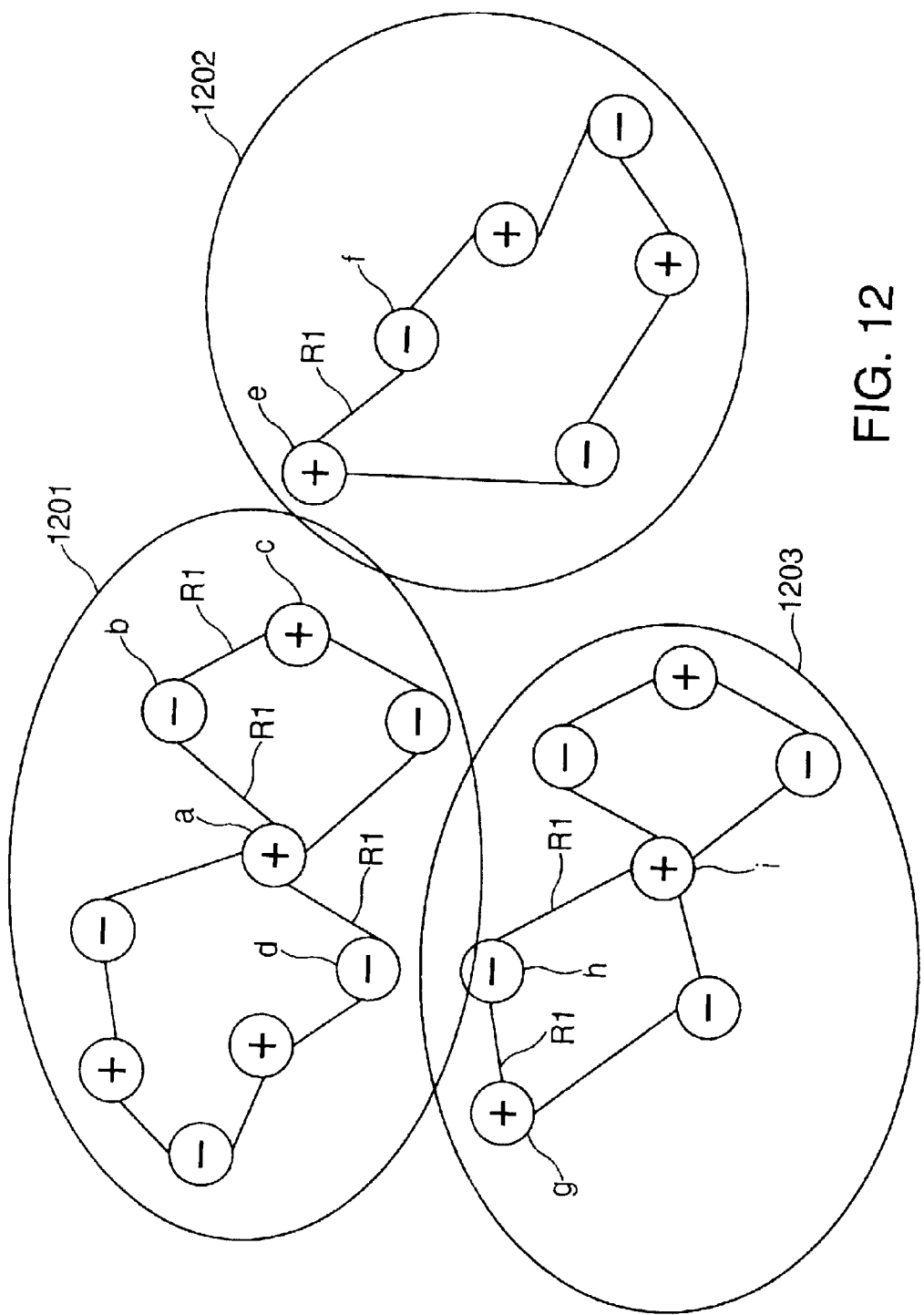
FIG. 12 schematically illustrates nets of intrusion pairs defined according to a first set of rules.

The generalized method of the present invention can be better understood by referring to FIG. 12, nets 1201, 1202 and 1203 are defined according to a set of rules having a high priority, and indicated schematically as R1. Examples of intrusion pairs within net 1201 as defined by first rule R1 include a-b, b-c and a-d. Similarly, first rule R1 defines intrusion pairs g-h and h-i which are included as part of net 1203, and intrusion pair e-f included within net 1202. First rule R1 is a high priority rule that is a requirement for an acceptable layout. The elements within each of nets 1201, 1202 and 1203 have alternating binary colors or polarities indicated by + and − signs. Typically, depending on the design, if a violation of a high priority rule occurs and cannot be corrected, the basic layout may have to be re-designed.

Figure 13:
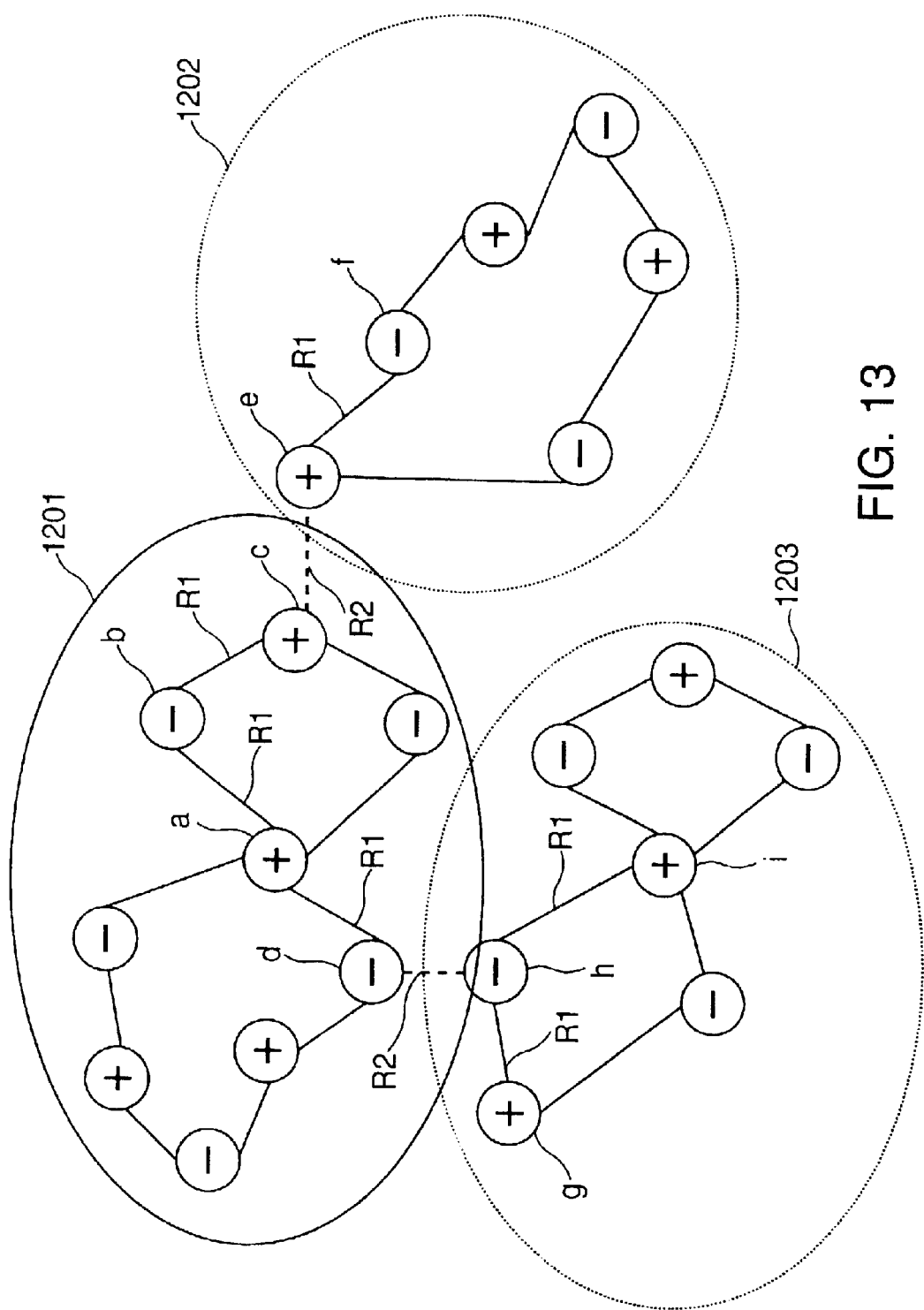
FIG. 13 schematically illustrates nets originally defined according to a first set of rules, and connected according to a second set of rules.
Figure 14:
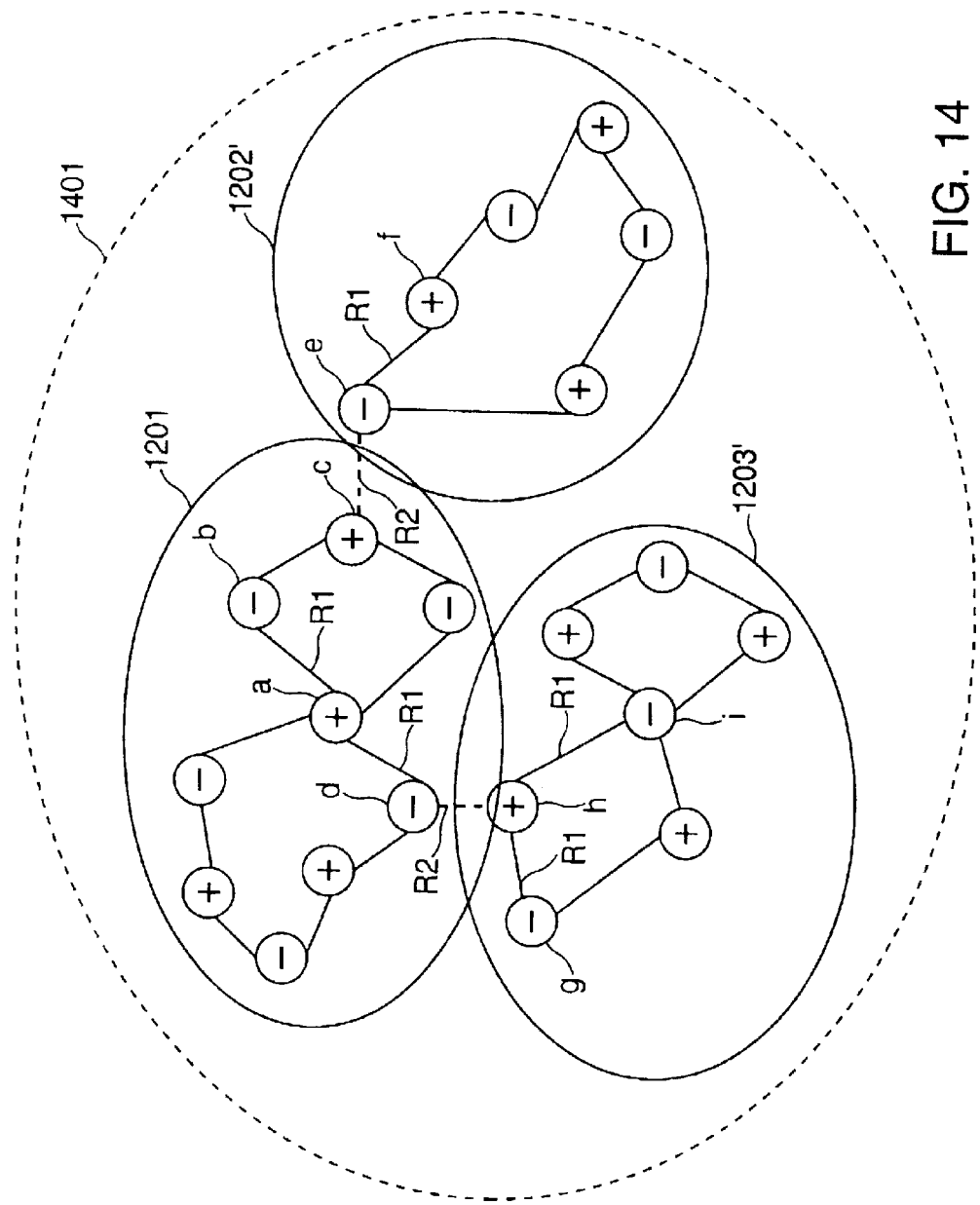
FIG. 14 schematically illustrates a combined and re-colored net according to a second set of rules.

Referring to FIG. 13, a second rule R2 is now applied. R2 is a lower priority rule which would be desirable but may not be critical for success of the design, as for example, the rule for minimum 180°—180° phase shape spacing as described above. Second rule R2 defines a connected relationship or intrusion pair of elements c-e connecting net 1201 to net 1202 and similarly another intrusion pair of elements d-h connecting net 1201 to net 1203. Since the elements of intrusion pairs c-e and d-h have conflicting polarity in violation of second rule R2, this conflict is resolved by reversing all of the polarities within the adjacent nets 1202 and 1203 to form modified nets 1202' and 1203' respectively as illustrated in FIG. 14. The nets 1201, 1202' and 1203' connected by second rule R2 now form a combined net 1401 in which each element conforms to the binary coloring rules. When the layout is checked, if a violation occurs based on second rule R2, it is flagged. However based on second rule R2 which has a lower priority than first rule R1, the layout may still be accepted in order to avoid an entire re-design of the layout, but at the expense of a sub-optimal layout, such as a reduced process window.

Figure 15:
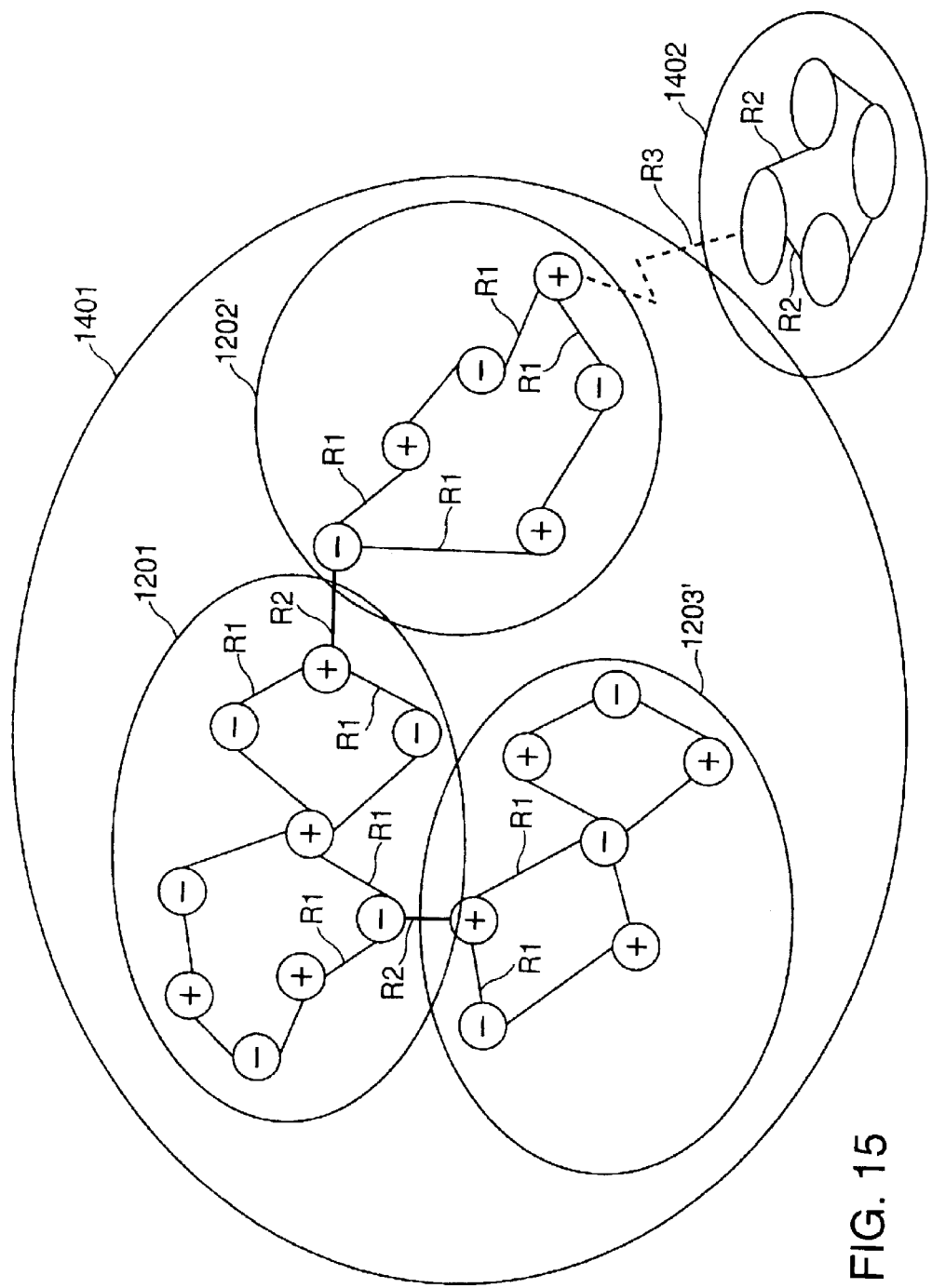
FIG. 15 schematically illustrates nets originally defined according to a first and second set of rules, and connected according to a third set of rules.

Similarly, a third rule R3 can be provided that defines intrusion pairs between other second rule R2-defined nets, as for example R3 connecting nets 1401 and 1402 schematically illustrated in FIG. 15.

Figure 16:
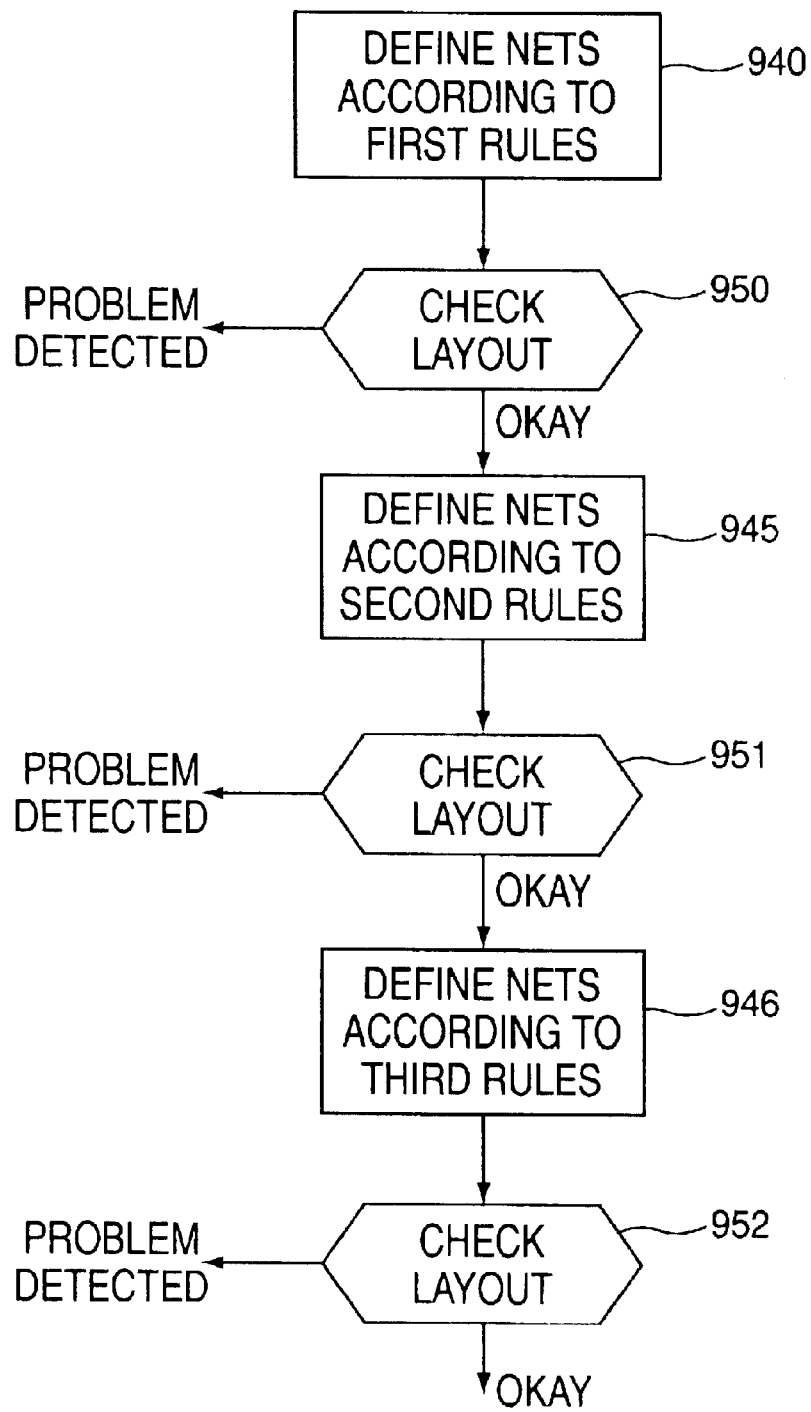
FIG. 16 illustrates a flow chart of a method according to the present invention using three sets of rules.

The method of the present invention provides optimization of binary coloring sequentially based on a hierarchy of rules, as illustrated in FIG. 16 for the case of three rule sets in which first rules are applied in block 940 having the highest priority. A check of the layout as a whole for rule conflicts is performed in block 950. Any problems are flagged, and corrective action must then be taken, as normal. Assuming that the layout is acceptable, a second set of rules having lower priority than the first set of rules is then applied in block 945, which could allow for some violations of the second rules set if appropriate. A check of the layout after application of the second set of rules (Block 951) will flag problems with the layout that are not acceptable, but can allow layout conflicts based on violations of the second rule under certain-circumstances. For example, it might be to acceptable to allow a reduced process window since the design might have been optimized based on higher priority rules, and a re-design is likely to be costly and risk violations of a higher priority rule. This can be followed by another optimization based on a third set of rules in block 946, where the third set of rules has a lower priority than the second set of rules applied in block 945. Once again, violations of the third set of rules may be allowed if appropriate (Block 952).

It will be appreciated by those skilled in the art that the method and software in accordance with the present invention is not limited to the embodiments discussed above. Accordingly, the invention is intended to encompass all such alternatives, modifications and variations which fall within the scope and spirit of the invention and the following claims.

We claim:

1. A computer program product comprising a computer readable storage medium having stored therein instructions executable by the computer for performing a method for assigning a binary property to circuit elements, the method comprising:

providing a circuit design having elements;

providing a first rule (R1) set for defining an R1 intrusion pair comprising a first R1 element and a second R1 element that intrude according to said first rule set;

forming a plurality of first nets wherein each of said first nets comprises R1 intrusion pairs in accordance with said first rule set;

coloring each of said first nets so that said first R1 element and said second R1 element have opposite binary properties for all R1 intrusion pairs within a given one of said first nets;

providing a second rule (R2) set for defining an R2 intrusion pair comprising a first R2 element and a second R2 element that intrude according to said second rule set and wherein said second rule set has a lower priority than said first rule set;

forming at least one second net comprising an R2 intrusion pair wherein said first R2 element is contained in one of said first nets and said second R2 element is contained in a second of said first nets; and coloring said second of said first nets so that said second R2 element has an opposite binary property from said first R2 element and each of said first R1 elements and said second R1 elements have opposite binary properties for all R1 intrusion pairs within said at least one second net.

2. The computer program product of claim 1 wherein said method further comprises:

providing at least one additional rule (Ra) for defining an Ra intrusion pair having a first Ra element and a second Ra element that intrude according to said at least one additional rule, wherein each of said at least one additional have a lower priority than said second rule set;

forming, in decreasing priority order of rule sets, at least one additional net comprising an Ra intrusion pair wherein said first Ra element is contained in one of said nets formed in accordance with a rule set having a higher priority than said at least one additional rule set and wherein said second Ra element is contained in a different one of said nets formed in accordance with a rule set having a higher priority than said at least one additional rule set; and coloring said at least one additional net so that said second Ra element has an opposite binary property from said first Ra element without violating any of said rule sets having a higher priority than said at least one additional rule set.

* * * * *